(12) United States Patent  
Keena et al.

(10) Patent No.: US 8,039,359 B2
(45) Date of Patent: Oct. 18, 2011

(54) METHOD OF FORMING LOW CAPACITANCE ESD DEVICE AND STRUCTURE THEREFOR

(75) Inventors: Thomas Keena, Chandler, AZ (US); Ki Chang, Kansas City, MO (US); Francine Y. Robb, Fountain Hills, AZ (US); Mingjiao Liu, Gilbert, AZ (US); Ali Salih, Mesa, AZ (US); John Michael Parsey, Jr., Phoenix, AZ (US); George Chang, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 309 days.

(21) Appl. No.: 12/395,076

(22) Filed: Feb. 27, 2009

(65) Prior Publication Data

US 2009/0162988 A1  Jun. 25, 2009

Related U.S. Application Data

(62) Division of application No. 11/859,570, filed on Sep. 21, 2007, now Pat. No. 7,538,395.

(51) Int. Cl.
*H01L 21/76* (2006.01)
*H01L 23/62* (2006.01)

(52) U.S. Cl. ............ 438/430; 438/22; 438/47; 438/296; 438/297; 438/424; 257/51; 257/106; 257/199; 257/461; 257/509; 257/603; 257/929; 257/E21.644

(58) Field of Classification Search ............. 257/51, 257/106, 199, 461, 509, 603, 929, E21.644; 438/22, 47, 956, 983, 296, 297, 424, 430
See application file for complete search history.

(56) References Cited

U.S. PATENT DOCUMENTS

| | | | |
|---|---|---|---|
| 5,880,511 A | 3/1999 | Yu et al. | |
| 5,990,511 A | 11/1999 | Leas | |
| 6,115,592 A | 9/2000 | Ueda et al. | |
| 6,121,669 A | 9/2000 | Kalb et al. | |
| 6,140,674 A | 10/2000 | Hause et al. | |
| 6,365,932 B1* | 4/2002 | Kouno et al. | 257/341 |
| 6,489,660 B1 | 12/2002 | Einthoven et al. | |
| 6,822,295 B2 | 11/2004 | Larson | |
| 6,953,980 B2 | 10/2005 | Escoffier et al. | |
| 6,984,860 B2 | 1/2006 | Grivna et al. | |
| 7,384,854 B2* | 6/2008 | Voldman | 438/380 |
| 2003/0168701 A1* | 9/2003 | Voldman | 257/355 |
| 2003/0205775 A1 | 11/2003 | Einthoven et al. | |
| 2006/0181385 A1 | 8/2006 | Hurley | |
| 2007/0073807 A1 | 3/2007 | Bobde | |

OTHER PUBLICATIONS

NUF9300 Data Sheet, Product Preview, "5-Line EMI Filter with ESD Protection", Copyright Semiconductor Components Industries, LLC, Apr. 2005—Rev. P1, Publication Order No. NUF9300/D, 6pps.
Data Sheet, Semtech, "uClamp3301D Low Voltage uClamp(tm) for ESD and CDE Protection, Protection Products—MicroClamp(tm)", Revision Oct. 25, 2004, Copyright 2004 Semtech Corp., 6pps.
Data Sheet, Semtech, RClamp0502B Ultra-Low Capacitance TVS for ESD and CDE Protection, Protection Products—RailClamp(r) Revision Apr. 5, 2005, Copyright 2005 Semtech Corp., 9pps.

(Continued)

*Primary Examiner* — Long Tran
(74) *Attorney, Agent, or Firm* — Robert F. Hightower

(57) ABSTRACT

In one embodiment, the ESD device uses highly doped P and N regions deep within the ESD device to form a zener diode that has a controlled breakdown voltage.

12 Claims, 5 Drawing Sheets

OTHER PUBLICATIONS

Data Sheet, Semtech, "RClamp0514M RailClamp(r) Low Capacitance TVS Diode Array, Protection Products—RailClamp(r)", Revision Aug. 31, 2005, Copyright 2005 Semtech Corp., 11pps.

Data Sheet, Semtech, "RClamp05022P RClamp0524P Ultra Low Capacitance TVS Arrays, Protection Products—RailClamp(r)", Revision Sep. 19, 2006, Copyright 2006 Semtech Corp., 13pps.

* cited by examiner

US 8,039,359 B2

METHOD OF FORMING LOW CAPACITANCE ESD DEVICE AND STRUCTURE THEREFOR

CROSS-REFERENCE TO RELATED APPLICATIONS

The present application is a divisional application of prior U.S. application Ser. No. 11/859,570 filed on Sep. 21, 2007, now U.S. Pat. No. 7,538,395 which is hereby incorporated by reference, and priority thereto for common subject matter is hereby claimed. Additionally, this application is related to an application entitled "MULTI-CHANNEL ESD DEVICE AND METHOD THEREFOR" having application Ser. No. 11/859,624, having a common assignee, inventors Salih et al., and a filing date of Sep. 21, 2007.

BACKGROUND OF THE INVENTION

The present invention relates, in general, to electronics, and more particularly, to methods of forming semiconductor devices and structures.

In the past, the semiconductor industry utilized various methods and structures to form electro-static discharge (ESD) protection devices. According to one international specification, the International Electrotechnical Commission (IEC) specification commonly referred to as IEC 61000-4-2 (level 2), it is desirable for an ESD device to respond to a high input voltage and current within approximately 1 nano-second (the IEC has an address at 3, rue de Varembé, 1211 Genève 20, Switzerland).

Some of the prior ESD devices used a zener diode in combination with a P-N junction diode. In most cases, the device structures had a high capacitance, generally greater than about one to six (1-6 pico-farads). The high capacitance limited the response time of the ESD device and also was a load to the device that was connected to the ESD device. Some prior ESD devices operated in a punch-through mode which required the devices to have a very thin and accurately controlled epitaxial layer, generally less than about 2 microns, and required a low doping in the epitaxial layer. These structures generally made it difficult to accurately control the clamping voltage of the ESD device and especially difficult to control low clamping voltages, such as voltages of less than about ten volts (10 V). One example of such an ESD device was disclosed in U.S. Pat. No. 5,880,511 which issued on Mar. 9, 1999 to Bin Yu et al. Another ESD device utilized a body region of a vertical MOS transistor to form a zener diode at an interface with an underlying epitaxial layer. The doping profiles and thicknesses used for the ESD device resulted in a high capacitance and a slow response time. Additionally, it was difficult to control the low doping levels in the thin layers which made it difficult to control the breakdown voltage of the ESD device. An example of such an ESD device was disclosed in United States patent publication number 2007/0073807 of inventor Madhur Bobde which was published on Mar. 29, 2007.

Accordingly, it is desirable to have an electrostatic discharge (ESD) device that has a low capacitance, that has a fast response time, that reacts to both a positive and a negative ESD events, that has a well controlled clamp voltage, that is easy to control in manufacturing, and that has a clamp voltage that can be controlled to over a range of voltages from a low voltage to a high voltage.

For simplicity and clarity of the illustration, elements in the figures are not necessarily to scale, and the same reference numbers in different figures denote the same elements. Additionally, descriptions and details of well-known steps and elements are omitted for simplicity of the description. As used herein, current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
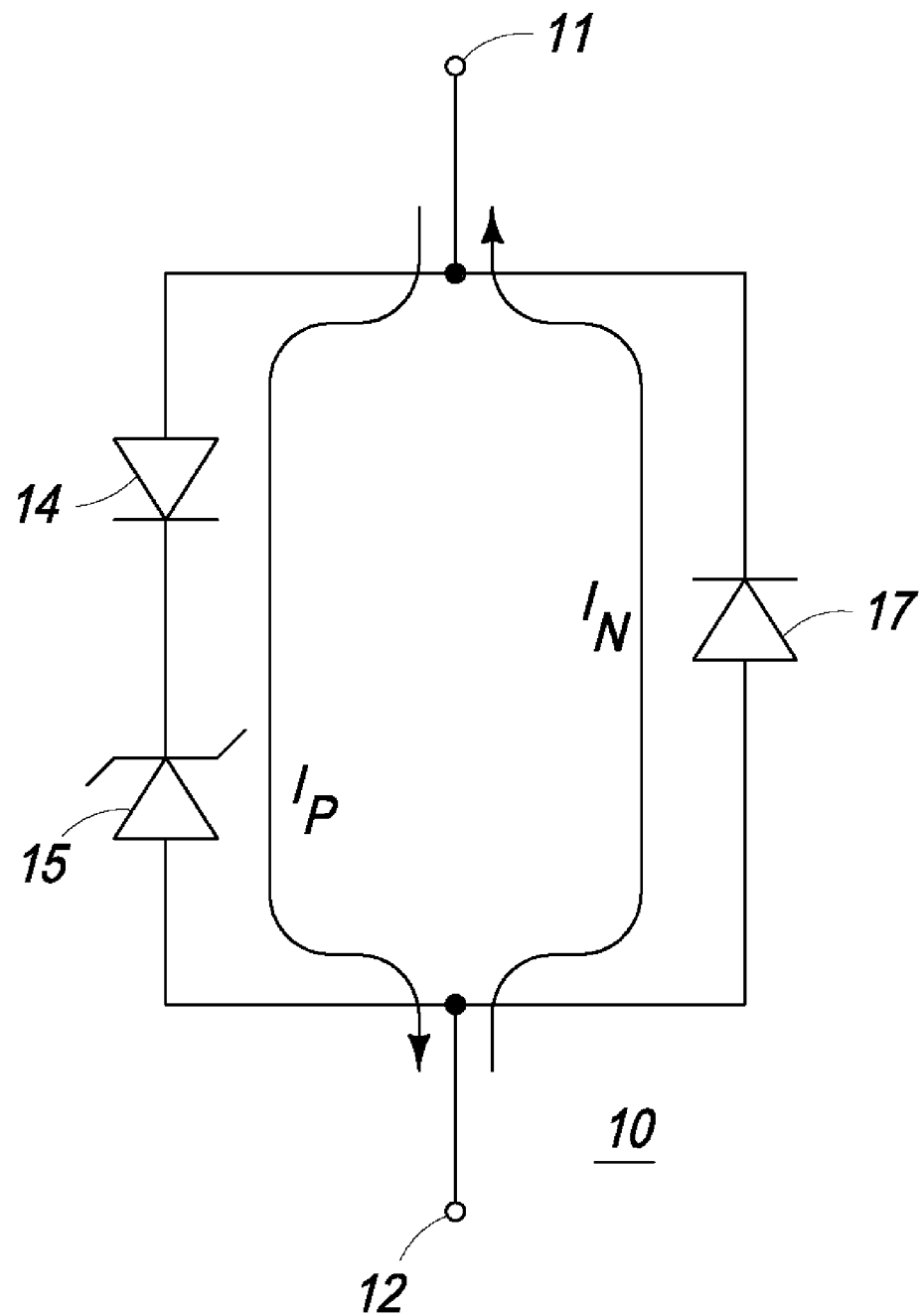
FIG. 1 schematically illustrates an embodiment of a portion of a circuit representation of an electro-static discharge (ESD) protection device in accordance with the present invention.

FIG. 1 schematically illustrates an embodiment of a portion of an electrostatic discharge (ESD) protection device or ESD device 10 that has a low capacitance and a fast response time. Device 10 includes two terminals, a first terminal 11 and a second terminal 12. Terminal 11 typically is an input terminal and terminal 12 generally is an output terminal that is connected to another element (not shown) that is to be protected by device 10. For example, terminal 11 may be connected to the high side of a regulated power supply (such as a 5V supply). Device 10 is configured to have a low capacitance between terminals 11 and 12. Device 10 also is formed to limit the maximum voltage that is formed between terminals 11 and 12 to the clamp voltage of device 10. A sharp breakdown voltage characteristic (or sharp knee) of device 10 assists in accurately controlling the value of the clamp voltage. The low capacitance assists in providing device 10 with a fast response time. Device 10 includes a first steering diode 14 that is formed as a P-N junction diode, a zener diode 15 that is connected in series with diode 14, and a second steering diode 17 that is formed as a P-N junction diode. Diode 17 is coupled in parallel with the series combination of diodes 14 and 15.

In normal operation, device 10 is biased to a normal operating voltage, such as a voltage that is between about one volt (1V) and the zener voltage of diode 15, by applying about one volt (1V) to terminal 11 and a ground reference voltage to terminal 12. Because of the hereinafter described characteristics of device 10, the capacitance of device 10 remains low as the voltage between terminals 11 and 12 varies over this normal operating voltage. However, the capacitance of an ESD device is customarily specified with zero volts applied across the device. This zero voltage condition is normally referred to as a zero bias condition. As will be seen further hereinafter, at this zero biased condition the hereinafter described low capacitance features of device 10 forms very low capacitance values for diodes 14 and 17. Since the capacitance of capacitors in series is smaller than that of the smallest capacitor, then the capacitance resulting from diodes 14 and 15 at this zero bias condition is smaller than the capacitance of either of diodes 14 or 15. The capacitance of device 10 is the additive product of the equivalent capacitance of diodes 14 and 15 plus the capacitance of diode 17. As will be seen further hereinafter, the capacitance of diode 17 is also very small, thus, the overall capacitance of device 10 is very small at this zero bias condition.

If a positive electro-static discharge (ESD) event is received on terminal 11, terminal 11 is forced to a large positive voltage relative to terminal 12. Because the anode of diode 14 is connected to terminal 11 and the cathode is connected to the cathode of diode 15, the large positive voltage forward biases diode 14 and reverse biases diode 15. As the voltage between terminals 11 and 12 reaches the positive threshold voltage of device 10 (the forward voltage of diode 14 plus the zener voltage of diode 15) a positive current (Ip) flows from terminal 11 through diodes 14 and 15 to terminal 12. Diode 15 clamps the maximum voltage applied to terminal 12 to approximately the zener voltage of diode 15 (plus the forward voltage of diode 14). The sharp knee of diode 15 causes diode 15 to rapidly clamp the maximum voltage between terminals 11 and 12 to the zener voltage of diode 15. The zener voltage of diode 15 generally is about two and one-half to eighty volts (2.5 V-80 V) and preferably is about five volts (5V). If a negative ESD event is received on terminal 11, terminal 11 is forced to a large negative voltage relative to terminal 12. Because the anode of diode 17 is connected to terminal 12 and the cathode is connected to terminal 11, the large negative voltage forward biases diode 17 and a negative current (In) flows from terminal 12 through diode 17 to terminal 11. Once diode 17 is forward biased, it will safely handle the negative ESD pulse, enabling device 10 to provide bidirectional ESD protection.

Figure 2:
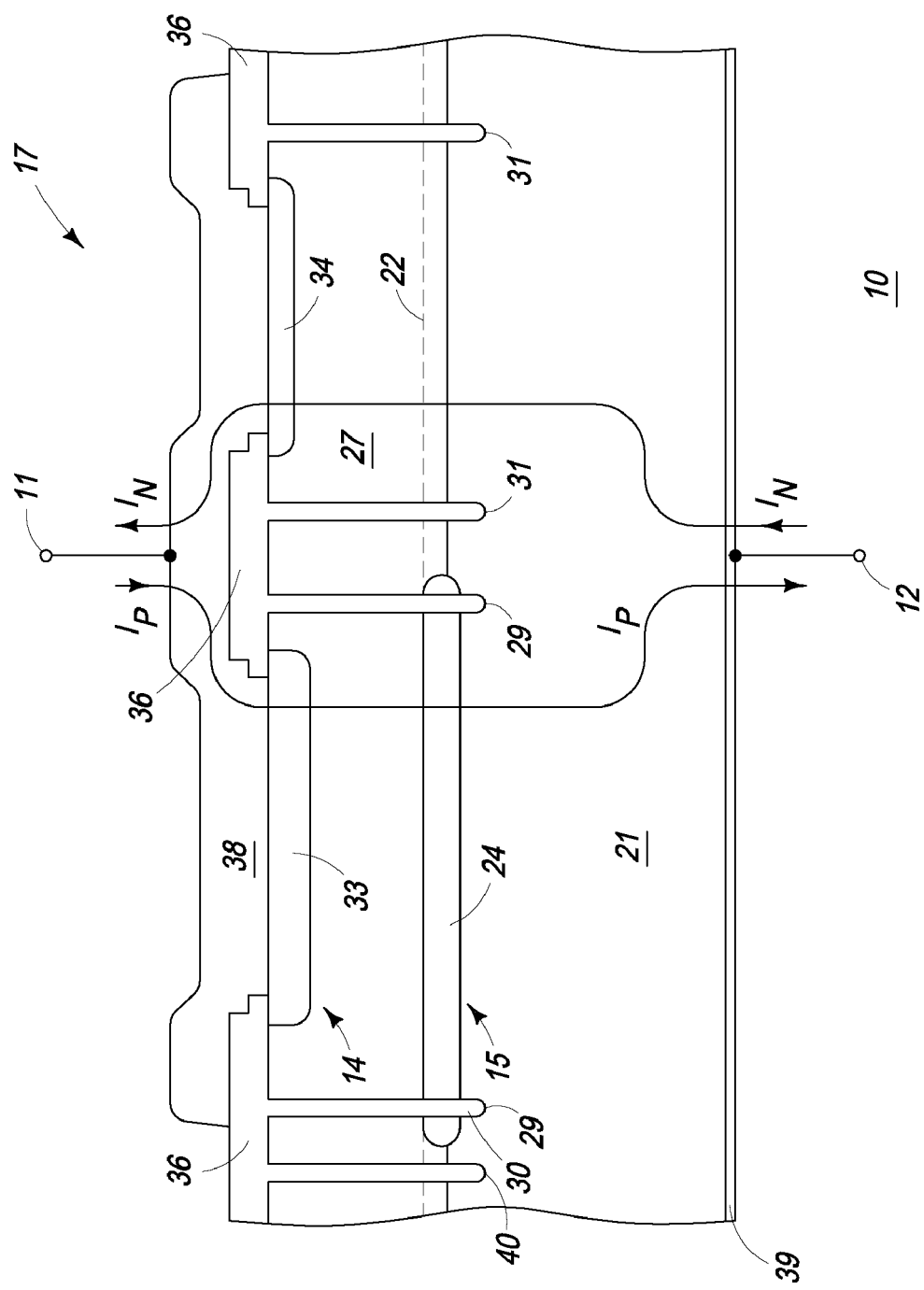
FIG. 2 illustrates a cross-section of a portion of an embodiment of the ESD device of FIG. 1 in accordance with the present invention.

FIG. 2 illustrates a cross-sectional view of a portion of an embodiment of ESD device 10. Diodes 14, 15, and 17 are formed on a semiconductor substrate 21. Diodes 14, 15, and 17 are identified in a general manner by arrows. A semiconductor layer 27 is formed on substrate 21, such as by epitaxial growth, and a portion of layer 27 may function as a drift region for diodes 14 and 17.

Figure 3:
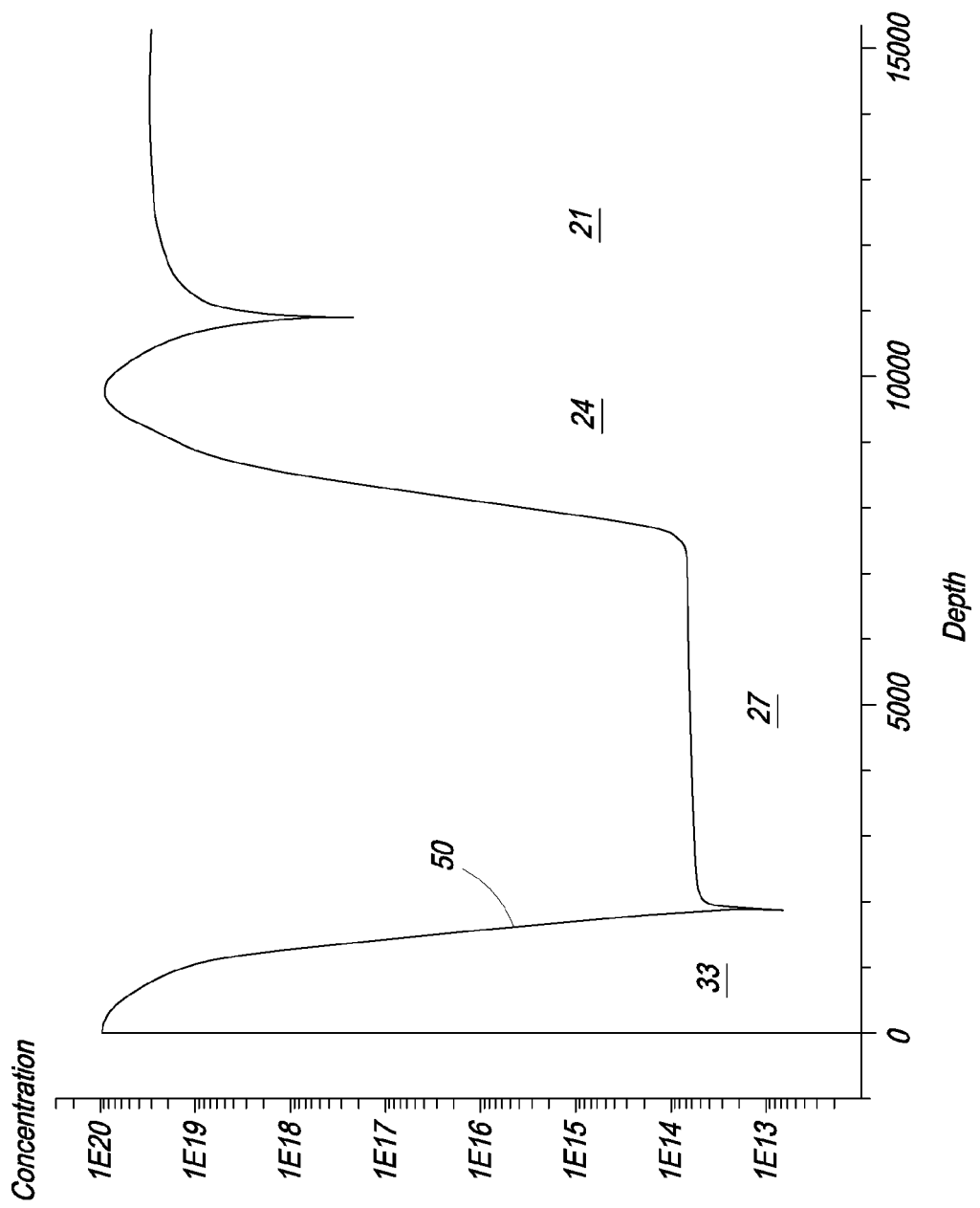
FIG. 3 is a graph illustrating some of the carrier concentrations of the ESD device of FIG. 1 and FIG. 2 in accordance with the present invention.

FIG. 3 is a graph illustrating the carrier concentration profile of the preferred embodiment of device 10. The abscissa indicates depth from the surface of layer 27 into device 10 and the ordinate indicates increasing value of the carrier concentration. A plot 50 illustrates the carrier concentration of device 10 that results from a positive bias applied from terminal 11 to terminal 12 (such as by a positive ESD event). This description has references to FIG. 1 and FIG. 2 in addition to FIG. 3.

A semiconductor region 24 is formed near the interface of the dopants that form layer 27 and the dopants of substrate 21 in order to form diode 15. In the preferred embodiment, substrate 21 is formed with a P-type conductivity having a doping concentration that is no less than approximately $1 \times 10^{19}$ atoms/cm$^3$ and preferably is between approximately $1 \times 10^{19}$ and $1 \times 10^{21}$ atoms/cm$^3$. In this preferred embodiment, semiconductor region 24 is formed as an N-type region having a doping concentration that is no less than approximately $1 \times 10^{19}$ atoms/cm$^3$ and preferably is between approximately $1 \times 10^{19}$ and $1 \times 10^{21}$ atoms/cm$^3$. Additionally, the thickness of region 24 generally is between about one and three (1-3) microns but may be other thicknesses. Because of the small thickness of region 24 in addition to the high doping concentration of region 24 and substrate 21, when device 10 receives a positive voltage from terminal 11 to terminal 12, the voltage causes the carrier concentration to be confined to a small and high density area within region 24 and near to the interface with substrate 21. This high concentration of carriers and dopants provides zener diode operating characteristics to the diode formed between substrate 21 and region 24 thereby forming zener diode 15. This combination also provides diode 15 with a very sharp transition or knee and allows very accurate control over the breakdown voltage or zener voltage of diode 15. The breakdown voltage or zener voltage of diode 15 can be adjusted by changing the carrier concentration of region 24 and/or substrate 21. Zener breakdown voltage is substantially more controllable than punch through breakdown voltage.

Layer 27 preferably is formed to have a lower peak doping concentration that is at least one order of magnitude less than the doping concentration of region 24 and generally is between about $1 \times 10^{13}$ and $1 \times 10^{17}$ atoms/cm$^3$. Layer 27 and region 24 may be formed on substrate 21 by a variety of methods that are well known to those skilled in the art. For example, a thin N-type epitaxial layer, illustrated by a dashed line 22, may be formed on substrate 21 as a first portion of layer 27. This first portion may selectively be doped to form region 24. Thereafter, the remainder of layer 27 may be formed.

Subsequently, isolation trenches 29 and 31 may be formed in order to isolate the portion of layer 27 where diode 14 is to be formed from the portion of layer 27 where diode 17 is to be formed. Trenches 29 and 31 generally are formed by a creating openings from a top surface of layer 27, through layer 27, and extending into substrate 21. Trench 29 also extends through region 24 a distance into substrate 21 in order to prevent conduction laterally through region 24 to layer 27 and diode 17. Trenches 29 and 31 are provided with isolation such as by forming a dielectric liner 30 along the sidewalls and bottoms of trenches 29 and 31 and filling the remaining opening with a dielectric or with doped or undoped polysilicon. Alternately, dielectric liner 30 may be formed along the sidewalls but not bottom of trenches 29 and 31. Methods to form trenches 29 and 31 are well known to those skilled in the art.

Because trench 29 extends through region 24, it reduces alignment tolerances and makes it easier to reliably produce device 10. Trench 29 preferably forms a closed polygon with a periphery that has an opening which encloses a portion of layer 27, trench 29 may be regarded as a multiply-connected domain. Similarly, trenches 31 may be regarded as a multiply-connected domain. Region 24 is positioned such that it extends between the outside edges of trench 29 but terminates before the outside edge of trench 31. This configuration assists in using region 24 to form a continuous zener diode 15 and to ensure region 24 does not extend into the portion of layer 27 underlying diode 17.

Diode 14 includes a doped region 33 that is formed on the surface of layer 27 with the same conductivity as substrate 21. Region 33 is formed to extend into layer 27 and overlie region 24. Region 33 generally is positioned so that the periphery of region 33 that is at the surface of layer 27 is completely surrounded by trench 29. Preferably, trench 29 is one continuous trench that is formed around region 33. The peak doping concentration of region 33 generally is greater than the peak doping concentration of layer 27 and preferably is approximately equal to the peak doping concentration of substrate 21. Region 33 generally is formed to extend a distance no greater than about two (2) microns and preferably about one tenth to two (0.1-2) microns from the surface into layer 27. The large differential doping concentration between region 33 and layer 27 and the shallow depth of region 33 assists in providing diode 14 with a very small capacitance. This very small capacitance of diode 14 under zero bias conditions assists in forming a small zero bias capacitance for device 10 as indicated hereinbefore. The capacitance of diode 14 at zero bias generally is less than about 0.4 pico-farads and the equivalent series capacitance of diodes 14 and 15 forms a capacitance for device 10 that is generally is less than about 0.2 pico-farads and preferably is no greater than about 0.01 pico-farads.

Region 33 is separated from region 24 by a distance that assists in minimizing the capacitance of diode 15. The spacing generally is approximately two to twenty (2-20) microns. The portion of layer 27 that is between regions 33 and 24 forms a drift portion of diode 14. The thickness of the drift region of layer 27 generally is at least around two microns in order to reduce the formation of parasitic transistors and to ensure that device 10 does not operate in a punch-through operating region.

A doped region 34 is formed within layer 27 with the opposite conductivity to substrate 21 in order to form diode 17. The peak doping concentration of region 34 is greater than the doping concentration of layer 27 and preferably is approximately equal to the peak doping concentration of substrate 21. Region 34 is formed on the surface of layer 27 and preferably extends approximately the same distance into layer 27 as region 33. However, region 34 does not overlie region 24. Region 34 is positioned so that the periphery of region 34 at the surface of layer 27 is completely surrounded by trench 31. Trench 31 preferably is one continuous trench. Because trench 31 extends through layer 27, it reduces the amount of layer 27 that is near region 24 thereby assisting in reducing the capacitance of diode 17. The low carrier concentration of layer 27 and the shallow depth of region 34 assist in providing diode 17 with a very small capacitance. This very small capacitance of diode 17 under zero bias conditions assists in forming a small zero bias capacitance for device 10 as indicated hereinbefore. The capacitance of diode 17 at zero bias generally is less than about 0.4 pico-farads and preferably is no greater than about 0.02 pico-farads.

Subsequently, a dielectric 36 may be formed on the surface of layer 27. Openings generally are formed through dielectric 36 to expose portions of regions 33 and 34. A conductor 38 may be applied to make electrical contact to both regions 33 and 34. Conductor 38 is subsequently connected to terminal 11. A conductor 39 is applied to a bottom surface of substrate 21 in order to form an electrode that is connected to terminal 12.

When device 10 receives a positive ESD voltage on terminal 11 relative to terminal 12, diode 14 is forward biased and diode 17 is reverse biased, and current Ip flows through diodes 14 and 15. Because of the depletion region, the carrier density in layer 27 is reduced further from the zero bias condition which further lowers the capacitance for diode 17. Even though diode 14 is forward biased, it has low capacitance due to the very low carrier concentration of region 27. The series connection of diodes 14 and 15 causes the combination of the two diodes to have small capacitance, which is smaller than that of diode 14 alone.

When an ESD event occurs, there is generally a large voltage and current spike that occurs over a brief period of time. Generally, the peak current and peak voltage occurs over a period of a few nanoseconds, typically less than two nanoseconds (2 nsec.) and could last for only about one nanosecond (1 nsec.). The current generally decreases to a plateau for another time interval usually around twenty (20) nanoseconds and slowly decreases over another twenty to forty (20-40) nanoseconds. The peak value of the current could be between one to thirty amperes (1 to 30 amps) and the peak voltage received from the ESD could be between two thousand and thirty thousand volts (2000-30000 V). The size and response time of the elements of device 10 preferably are configured to respond to the voltage during the time interval of the peak voltage and conduct the peak current. Since diodes 14 and 15 are connected in series, the effective capacitance is the total series capacitance. Because capacitors in series result in a capacitance that is less than the smallest capacitance, the low zero bias capacitance of diode 14 ensures that the capacitance of device 10 is low enough for device 10 to respond to the ESD event and conduct the ESD current during the peak ESD voltage and current.

Figure 4:
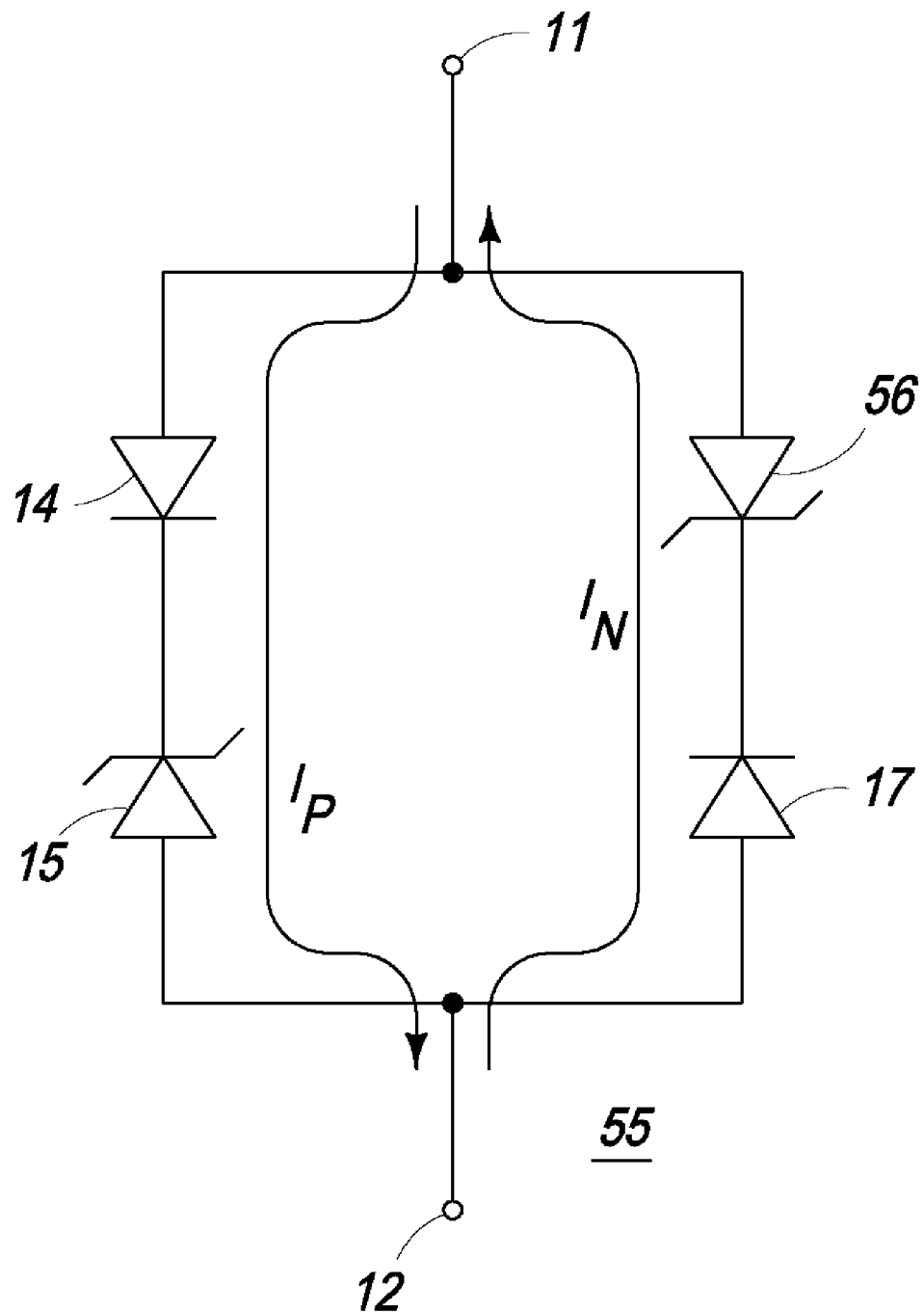
FIG. 4 schematically illustrates an embodiment of a portion of a circuit representation of another ESD device that is an alternate embodiment of the ESD device of FIG. 1-FIG. 3.

FIG. 4 schematically illustrates an embodiment of a portion of a circuit representation of an ESD device 55 that is an alternate embodiment of device 10 that was described in the description of FIG. 1-FIG. 3. The circuit schematic of device 55 is similar to the circuit schematic of device 10 except that device 55 includes a zener diode 56. Thus, diode 56 has a cathode that is connected to the cathode of diode 17, and an anode that is connected to terminal 11. Under zero bias conditions, the equivalent capacitance of the first branch of device 55 that includes diodes 17 and 56 forms a low equivalent capacitance that is lower than the capacitance of either of diodes 17 or 56. Similarly, the second branch that includes diodes 14 and 15 forms a low equivalent capacitance as described hereinbefore. The overall capacitance of device 55 is the addition of the capacitance of the two parallel branches which provides low capacitance due to the small capacitance of each branch.

Figure 5:
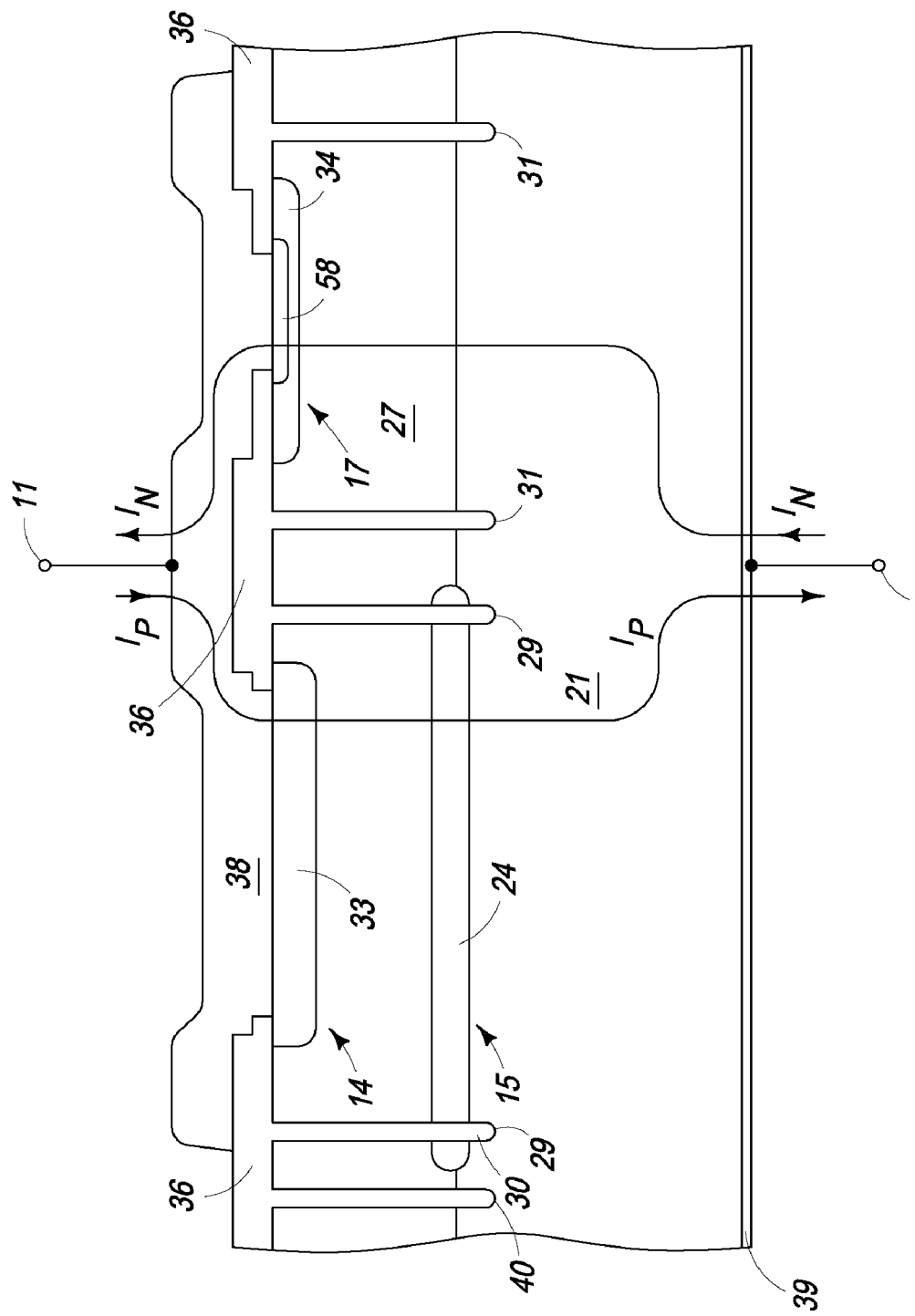
FIG. 5 illustrates a cross-sectional portion of an embodiment of the ESD device of FIG. 4 in accordance with the present invention.

FIG. 5 illustrates a cross-sectional portion of device 55. The cross-section of device 55 is similar to the cross-section of device 10 except that device 55 includes a doped region 58 that is formed within region 34. Region 58 has the conductivity type and preferably the doping concentration of substrate 21. The high doping concentration of regions 34 and 58 forms a sharp knee for diode 56 without affecting the capacitance of diode 17. Adding diode 56 in series with diode 17 provides device 55 bidirectional ESD protection and also configures device 55 with a substantially symmetrical clamping voltage for both the Ip and In current paths.

Although the doping concentrations given for regions 24 and 34 are those for the preferred embodiment of a five volt (5V) breakdown voltage for respective diodes 15 and 56, those skilled in the art will appreciate that the doping concentrations may have to change for other breakdown voltages. For example, for an eighty volt (80V) breakdown voltage, the doping concentration of regions 24 and 34 may be decreased, or the doping concentration of substrate 21 may be decreased, or regions 24 and 34 along with substrate 21 may be decreased. Generally, the doping concentration of layer 27 is at least one order of magnitude less than the doping concentration of region 24.

In view of all of the above, it is evident that a novel device and method is disclosed. Included, among other features, is forming an ESD device that has a highly doped P-type substrate, a lightly doped N-type layer on the substrate, and a highly doped N-type layer that is positioned adjacent to a portion of the substrate and between the lightly doped N-type layer in order to form a zener diode. Also included is a highly doped P-type layer overlying the highly doped N-type layer in order to form a P-N diode. The doping concentrations and thicknesses result in an ESD device that has a low capacitance and can respond to an ESD event within less than one nanosecond (1 nsec.). The high doping concentrations of substrate 21 and region 24 provides a zener diode having a well control breakdown voltage and a clamp voltage that can be controlled over a range of about 2.5 to 80 volts.

While the subject matter of the invention is described with specific preferred embodiments, it is evident that many alternatives and variations will be apparent to those skilled in the semiconductor arts. For example, all the doping types may be reversed. Those skilled in the art will appreciate that either of trench 29 or 31 may be omitted and device 10 will be functional and have a low capacitance to respond in the time intervals as described hereinbefore. Although the devices were described herein as being formed on a silicon substrate, those skilled in the art will appreciate that other semiconductor materials may be used including gallium arsenide, silicon carbide, gallium nitride, and other semiconductor materials. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming an ESD device comprising:
   providing a semiconductor substrate of a first conductivity type and having a first peak doping concentration;
   forming a first semiconductor region of a second conductivity type and at least approximately the first peak doping concentration wherein the first semiconductor region forms a first P-N junction with the semiconductor substrate;
   forming an epitaxial layer on the first semiconductor region wherein the epitaxial layer has the second conductivity type and a second peak doping concentration;
   forming a first doped region of the first conductivity type on the epitaxial layer and overlying the first semiconductor region;
   forming a first isolation trench extending vertically from a top surface of the epitaxial layer through the first semiconductor region and into the semiconductor substrate wherein the first isolation trench extends laterally around an outside perimeter of the first doped region; and
   forming a second doped region of the second conductivity type on the epitaxial layer and overlying a portion of the semiconductor substrate but not overlying the first semiconductor region.

2. The method of claim 1 forming the second doped region of the second conductivity type includes forming the second doped region with approximately the first peak doping concentration and on the epitaxial layer.

3. The method of claim 1 further including forming a second isolation trench extending vertically from a top surface of the epitaxial layer through the epitaxial layer and into the semiconductor substrate wherein the second isolation trench extends laterally around an outside perimeter of the second doped region.

4. The method of claim 1 further including forming third doped region of the first conductivity type within the second doped region wherein a P-N junction formed between the second and third doped regions forms a zener diode.

5. The method of claim 1 wherein forming the first isolation trench includes forming an opening from the top surface of the epitaxial layer through the first doped region and into the semiconductor substrate and forming a dielectric within the opening.

6. The method of claim 1 wherein forming the first semiconductor region includes forming the first P-N junction as a junction of a zener diode wherein the first peak doping concentration is formed to be no less than approximately $1 \times 10^{19}$ atoms/cm$^3$ and the second peak doping concentration is formed to be no greater than approximately $1 \times 10^{17}$ atoms/cm$^3$.

7. The method of claim 1 wherein forming the first doped region. includes forming a second P-N junction between the first doped region and the epitaxial layer and using the second P-N junction as a junction of a diode.

8. A method of forming a semiconductor device comprising:
   providing a semiconductor substrate of a first conductivity type and having a first peak doping concentration wherein the semiconductor substrate has first and second surfaces;
   forming a first semiconductor region of a second conductivity type and adjacent to a portion of dopants of the semiconductor substrate wherein the first semiconductor region forms a first P-N junction with the dopants of the semiconductor substrate and wherein the first P-N junction forms a zener diode;
   forming a second semiconductor region on the first semiconductor region wherein the second semiconductor region has the second conductivity type and a second peak doping concentration;
   forming a first P-N diode that includes a first doped region of the first conductivity type and approximately the first peak doping concentration on the second semiconductor region and overlying at least a portion of the first semiconductor region;
   forming a first isolation trench extending vertically from a top surface of the second semiconductor region through the first semiconductor region and into the semiconductor substrate wherein the first isolation trench extends laterally around an outside perimeter of the first doped region; and
   forming a second doped region of the second conductivity type and approximately the first peak doping concentration on the second semiconductor layer and overlying a portion of the semiconductor substrate but not overlying the first semiconductor region.

9. The method of claim 8 wherein forming the second semiconductor region includes forming the second semiconductor region with a thickness that is between approximately two to twenty microns.

10. The method of claim 9 wherein forming the first semiconductor region includes forming the first semiconductor region with a thickness of approximately one to three microns.

11. The method of claim 8 wherein forming the second semiconductor region includes forming the second semiconductor region with the second peak doping concentration that is no greater than approximately $1\times10^{17}$ atoms/cm$^3$; and forming the first peak doping concentration to be no less than approximately $1\times10^{19}$ atoms/cm$^3$.

12. A method of forming a semiconductor device comprising:
    providing a semiconductor substrate of a first conductivity type and having a first peak doping concentration wherein the semiconductor substrate has first and second surfaces;
    forming a first semiconductor region of a second conductivity type and adjacent to a portion of dopants of the semiconductor substrate wherein the first semiconductor region forms a first P-N junction with the dopants of the semiconductor substrate and wherein the first P-N junction forms a zener diode;
    forming a second semiconductor region on the first semiconductor region and on a portion of the first surface of the semiconductor substrate wherein the second semiconductor region has the second conductivity type and a second peak doping concentration;
    forming a first P-N diode that includes a first doped region of the first conductivity type and approximately the first peak doping concentration on the second semiconductor region and overlying at least a portion of the first semiconductor region;
    forming a first isolation trench extending vertically from a top surface of the second semiconductor region through the first semiconductor region and into the semiconductor substrate wherein the first isolation trench extends laterally around an outside perimeter of the first doped region;
    forming a second doped region of the second conductivity type and approximately the first peak doping concentration on the second semiconductor region wherein the second doped region is spaced apart from the first doped region and is not overlying the first semiconductor region; and
    forming a second isolation trench extending vertically from the top surface of the second semiconductor region and into the semiconductor substrate wherein the second isolation trench extends laterally around an outside perimeter of the second doped region.

* * * * *